United States Patent [19]
Sakurai

[11] Patent Number: 5,278,516
[45] Date of Patent: Jan. 11, 1994

[54] BUFFER CIRCUIT

[75] Inventor: Katsuhito Sakurai, Atsugi, Japan

[73] Assignee: Canon Kabushiki Kaisha, Tokyo, Japan

[21] Appl. No.: 40,573

[22] Filed: Mar. 31, 1993

Related U.S. Application Data

[63] Continuation of Ser. No. 790,438, Nov. 12, 1991, abandoned.

[30] Foreign Application Priority Data

Nov. 19, 1990 [JP] Japan .................. 2-311277

[51] Int. Cl.[5] .............................. H03F 3/30
[52] U.S. Cl. .................. 330/267; 330/299; 330/311
[58] Field of Search ............. 330/263, 267, 299, 310, 330/311

[56] References Cited

U.S. PATENT DOCUMENTS 4,714,844 12/1987 Muto .................. 307/494
4,716,305 12/1987 Sakuragi et al. ........ 307/296
4,780,689 10/1988 Saller et al. ........... 330/267

FOREIGN PATENT DOCUMENTS 1548841 3/1990 U.S.S.R. ............... 330/267

OTHER PUBLICATIONS

International Journal of Electronics, vol. 59, No. 6, Dec. 1985, pp. 771-777, Normand, G.: "Translinear Current Conveyors".
International Journal of Electronics, vol. 57, No. 5, Nov. 1984, Fabre, A.: "An Integrable Multiple Output Translinear Current Convertor".
Electronic Design, vol. 35, No. 5, Mar. 5, 1987, pp. 71-74, Goodenough, F.: "Electronic Design Report ISSCC: ANALOG".

Primary Examiner—James B. Mullins
Attorney, Agent, or Firm—Fitzpatrick, Cella, Harper & Scinto

[57] ABSTRACT

A buffer circuit provided with a transistor each on the input and output terminal sides, in which the transistor has been provided in order to keep constant a difference between a collector-emitter voltage of the input terminal side transistor and that of the output terminal side transistor.

3 Claims, 2 Drawing Sheets

BUFFER CIRCUIT

This application is a continuation of application Ser. No. 07/790,438 filed Nov. 12, 1991, now abandoned.

BACKGROUND OF THE INVENTION

1. Field of the Invention

This invention relates to a buffer circuit for use in, for example, impedance conversion, an input unit for current feedback type operational amplifiers and the like.

2. Related Background Art

Heretofore, the buffer circuit is composed of diode-connected transistors 15 and 16 which are opposite to each other in polarity, transistors 17 and 18 matching those transistors 15 and 16 respectively, and constant-current sources 19 and 20 for feeding constant current to the transistors 15 and 16 as shown in FIG. 1.

In the above conventional example, however, the transistors 15 and 17, and the transistors 16 and 18, for which matching is required respectively, are operated by a different C-E (Collector-Emitter) voltage. Therefore, an offset appears between input (IN) and output (OUT) due to the Early's effect of transistors, possibly causing a malfunction.

SUMMARY OF THE INVENTION

It is an object of the present invention to provide a buffer circuit obtained by solving the above problem of occurrence of such an offset.

It is a further object of the present invention to provide a buffer circuit provided with a transistor each on the input and output terminal sides, characterized in that the transistor has been provided in order to keep constant a difference between a collector-emitter (C-E) voltage of the input terminal side transistor and that of the output terminal side transistor, and to provide an operational amplifier having such a buffer circuit.

According to the present invention, the offset between the input and output terminals can be reduced for correct operations by the provision of a transistor which keeps constant the difference in the collector-emitter (C-E) voltage between transistors for which matching is required.

DESCRIPTION OF THE PREFERRED EMBODIMENTS

Figure 1:
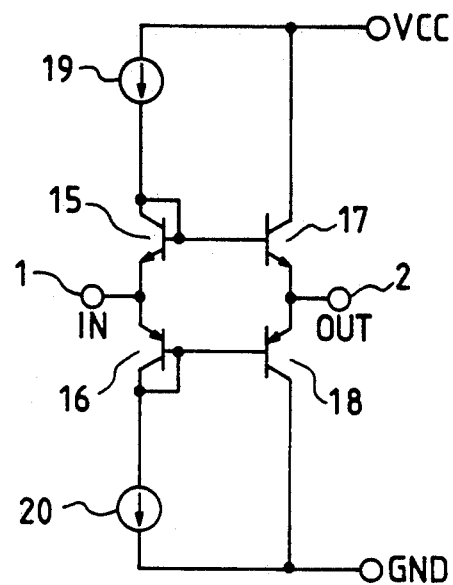
FIG. 1 is a circuit diagram of a buffer circuit according to a conventional example.

The present invention will hereinafter be described in detail with respect to embodiments thereof shown in the drawings.

(First Embodiment)

Figure 2:
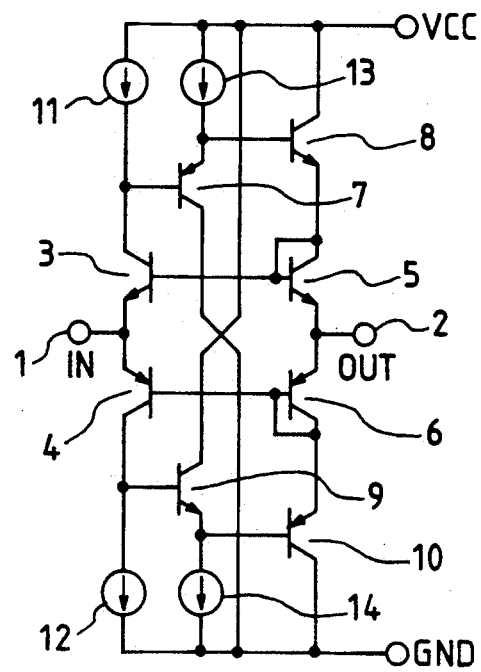
FIG. 2 is a circuit diagram of a buffer circuit embodying the concept of the present invention.

A preferred embodiment of the present invention is best shown in FIG. 2. In FIG. 2, numeral 1 is an input terminal, and numeral 2 is an output terminal. Transistors 3 and 4, which are opposite to each other in polarity, are connected with the input terminal 1, and are biased by constant-current sources 11 and 12 respectively. Transistors 5 and 6 are connected with the output terminal 2, and are diode-connected with a short between the base and the collector, requiring matching with those transistors 3 and 4 respectively. Transistors 7 and 8, and transistors 9 and 10 are used to keep constant the C-E voltage of the transistors 3 and 4, and the transistors 7 and 8 are biased by constant-current sources 13 and 14 respectively.

When an input voltage is applied to the input terminal 1, a voltage of the same value is output at the output terminal 2. At this time, the C-B (collector-base) voltage of the transistor 3 is kept down at 0 (V) by means of Vbe of the transistors 7 and 8, and the C-E voltage of the transistor 3 is kept down at $1 \times Vbe$ (V).

Similarly, the C-B voltage of the transistor 4 is kept down at 0 (V) by means of Vbe of the transistors 9 and 10, and the C-E voltage of the transistor 4 at $1 \times Vbe$ (V). Since the transistors 3 and 5, and the transistors 4 and 6 are operating at the same C-E voltage $1 \times Vbe$ (V), there is no difference in operating current between the two due to the Early's effect, but an offset between the input and output terminals is very small. The circuit described above is integrated on a semiconductor substrate for formation.

(Second Embodiment)

Figure 3:
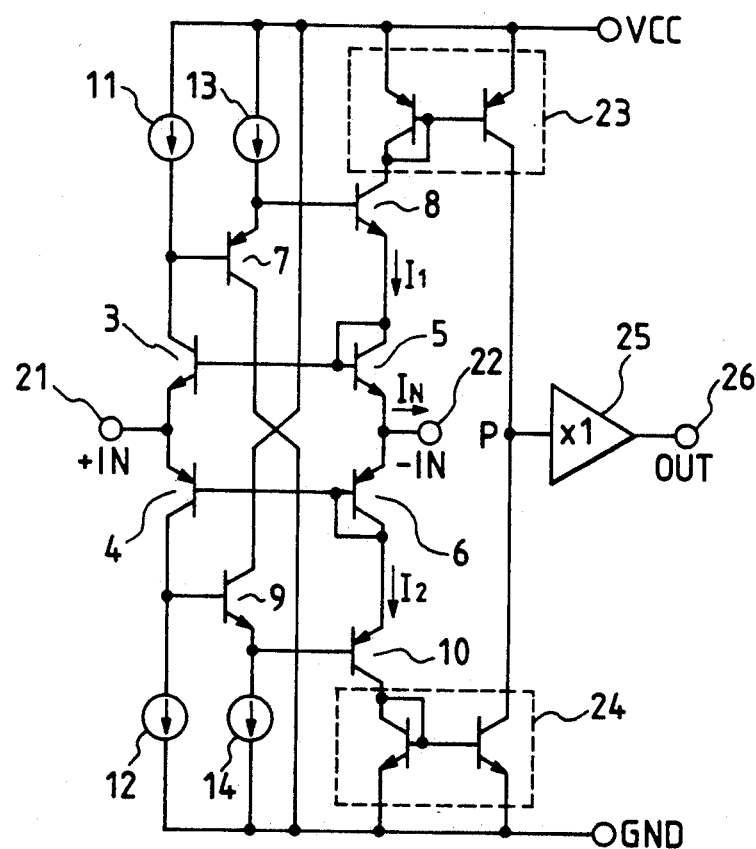
FIG. 3 is a circuit diagram of an input buffer for current feedback type operational amplifiers embodying the concept of the present invention.

FIG. 3 shows an example in which the above embodiment has been used as an input buffer for a current feedback type operational amplifier. In FIG. 3, numeral 21 is a forward input terminal, numeral 22 is a reverse input terminal, numerals 23 and 24 are current mirror circuits, numeral 25 is an output buffer, and numeral 26 is an output terminal.

An input current IN flows through the reverse input terminal 22 by an input voltage applied to between the forward and reverse input terminals, and becomes a differential current between a current $I_1$ above and a current $I_2$ below the reverse input terminal 22. This differential current flows to the output stage through current mirror circuits 23 and 24, is converted into a voltage at a point P, and is output at the output terminal 26 through an output buffer 25.

An offset between forward 21 and reverse 22 input terminals at this time is increased by the gain times and becomes an offset at the output terminal 26. When a buffer circuit according to the present invention is used as an input buffer, the offset between the forward 21 and reverse 22 input terminals becomes very small, and as a result, the offset at the output terminal 26 is also reduced. This operational amplifier consists of a semiconductor integrated circuit.

According to the present invention as described above, an offset between an input and output can be reduced by keeping down at a very small value a C-E voltage difference between transistors for which matching is required to each other for operation.

What is claimed is:

1. A buffer circuit comprising:
   an input stage having a first transistor of a first conductivity type, and a second transistor of a second conductivity type different from the first conductivity type, each having a base, a collector and an emitter, and said input stage having an input terminal connected to the emitters of said first and second transistors;
   an output stage having a third transistor of the first conductivity type, a fourth transistor of the second conductivity type, each having a base, a collector and an emitter, and a terminal connected to the emitters of said third and fourth transistors;

first connecting means for connecting the base of said first transistor with the base and the collector of said third transistor;

second connecting means for connecting the base of said second transistor with the base and the collector of said fourth transistor;

a first emitter follower level shift circuit for connecting the collector of said first transistor with the collector of said third transistor, having a fifth transistor of said first conductivity type and a sixth transistor of said second conductivity type; and a second emitter follower level shift circuit for connecting the collector of said second transistor with the collector of said fourth transistor, having a seventh transistor of said first conductivity type and en eighth transistor of said second conductivity type, wherein said level shift circuits are operated to keep a voltage difference between a collector-emitter voltage of said input stage and a collector-emitter voltage of said output stage substantially zero.

2. A current feedback type operational amplifier having an input unit provided with a buffer circuit according to claim 1.

3. The buffer circuit according to claim 1, wherein said buffer circuit constitutes a semiconductor integrated circuit.

* * * * *

UNITED STATES PATENT AND TRADEMARK OFFICE
CERTIFICATE OF CORRECTION

PATENT NO. : 5,278,516
DATED : January 11, 1994
INVENTOR(S) : KATSUHITO SAKURAI

It is certified that error appears in the above-identified patent and that said Letters Patent is hereby corrected as shown below:

COLUMN 4

Line 3, "en" should read --an--.

Signed and Sealed this

Nineteenth Day of July, 1994

Attest:

BRUCE LEHMAN

Attesting Officer

Commissioner of Patents and Trademarks